(12) United States Patent
Venkataraman et al.

(10) Patent No.: US 11,722,142 B1
(45) Date of Patent: Aug. 8, 2023

(54) CHARGE PUMP WITH OUTPUT CURRENT ADJUSTMENT

(71) Applicant: Texas Instruments Incorporated, Dallas, TX (US)

(72) Inventors: Jagannathan Venkataraman, Bangalore (IN); Ani Xavier, Bangalore (IN); Shyam Subramanian, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/849,594

(22) Filed: Jun. 25, 2022

(51) Int. Cl.
*H03L 7/099* (2006.01)

(52) U.S. Cl.
CPC .................. *H03L 7/0992* (2013.01)

(58) Field of Classification Search
CPC ...... H02M 3/073; H02M 3/075; H02M 3/076; H02M 3/077; H02M 3/078; H02M 3/071; H02M 1/0003; H03K 2217/00; H03K 2217/0018
See application file for complete search history.

(56) References Cited

U.S. PATENT DOCUMENTS

| | | | | |
|---|---|---|---|---|
| 7,639,041 B1 * | 12/2009 | Perisetty | ............ | H03K 19/0016 326/38 |
| 8,742,502 B2 * | 6/2014 | Brindle | ............. | H01L 29/78609 257/347 |
| 11,457,167 B2 * | 9/2022 | Matsuzaki | .............. | H02M 3/07 |

* cited by examiner

*Primary Examiner* — Diana J. Cheng
(74) *Attorney, Agent, or Firm* — Valerie M. Davis; Frank D. Cimino

(57) ABSTRACT

In described examples, a charge pump includes an output, first and second transistors, a control circuit, a multiplexer, and a calibration circuit. The first transistor's drain is coupled to the output. The second transistor's drain is part of a current path separate from a current path that includes the first transistor's drain. The control circuit generates a control signal in response to voltages at the gates of the first and second transistors. First and second inputs of the multiplexer are respectively coupled to sources of the first and second transistors. A control input of the multiplexer is coupled to receive the control signal. A first input of the calibration circuit is coupled to an output of the multiplexer. A second input of the calibration circuit receives a reference voltage. First and second outputs of the calibration circuit are respectively coupled to body terminals of the first and second transistors.

20 Claims, 3 Drawing Sheets

CHARGE PUMP WITH OUTPUT CURRENT ADJUSTMENT

TECHNICAL FIELD

This application relates generally to charge pumps in phase locked loops (PLLs), and more particularly to a charge pump with output current adjustment.

BACKGROUND

Some devices, such as serializer/deserializers ("SerDes") and retimers, receive a data stream generated using a clock signal, but do not receive the generating clock signal. In some examples, these devices use a clock data recovery (CDR) loop to generate a new clock signal with a frequency (as close to the frequency of the original clock signal as possible) and a phase (matching the phase of the received data stream). A CDR includes a phase locked loop (PLL) or a delay locked loop (DLL), with a charge pump, a loop filter, and a feedback loop.

For example, a SerDes is used in high speed communications to enable devices to reduce a required number of input/output channels, such as interconnects between integrated circuits (ICs) on a printed circuit board (PCB). The SerDes translates a data stream between parallel and serial communication interfaces, using CDR to generate a clock signal corresponding to the clock signal used to generate the data stream. The SerDes multiplies (or divides) this generated clock signal by a selected factor so that the SerDes can translate the data stream between clock domains applicable to the parallel and serial communication regimes.

In another example, a retimer is used to detect a data stream, and to generate and transmit a fresh copy of the data stream. This is used, for example, to extend a useful transmission range of the data stream. The retimer uses CDR to generate a clock signal corresponding to the clock signal used to generate the data stream, and uses the generated clock signal to generate the fresh copy of the data stream.

SUMMARY

In described examples, a charge pump includes an output, first and second transistors, a control circuit, a multiplexer, and a calibration circuit. The first transistor's drain is coupled to the output. The second transistor's drain is part of a current path separate from a current path that includes the first transistor's drain. The control circuit generates a control signal in response to voltages at the gates of the first and second transistors. First and second inputs of the multiplexer are respectively coupled to sources of the first and second transistors. A control input of the multiplexer is coupled to receive the control signal. A first input of the calibration circuit is coupled to an output of the multiplexer. A second input of the calibration circuit receives a reference voltage. First and second outputs of the calibration circuit are respectively coupled to body terminals of the first and second transistors.

BRIEF DESCRIPTION OF THE DRAWINGS

The same reference numbers or other reference designators are used in the drawings to designate the same or similar (structurally and/or functionally) features.

DETAILED DESCRIPTION

In some examples, a phase locked loop (PLL) is used to multiply a clock and reduce jitter. Jitter is a signal's deviation from accurate periodicity. However, at sufficiently high data clock rates, jitter in the form of small clock phase offsets from an optimal sampling time of a clock recovered by a PLL can significantly impact a CDR system's bit error rate (BER, a number of bit errors per unit time).

Figure 1:
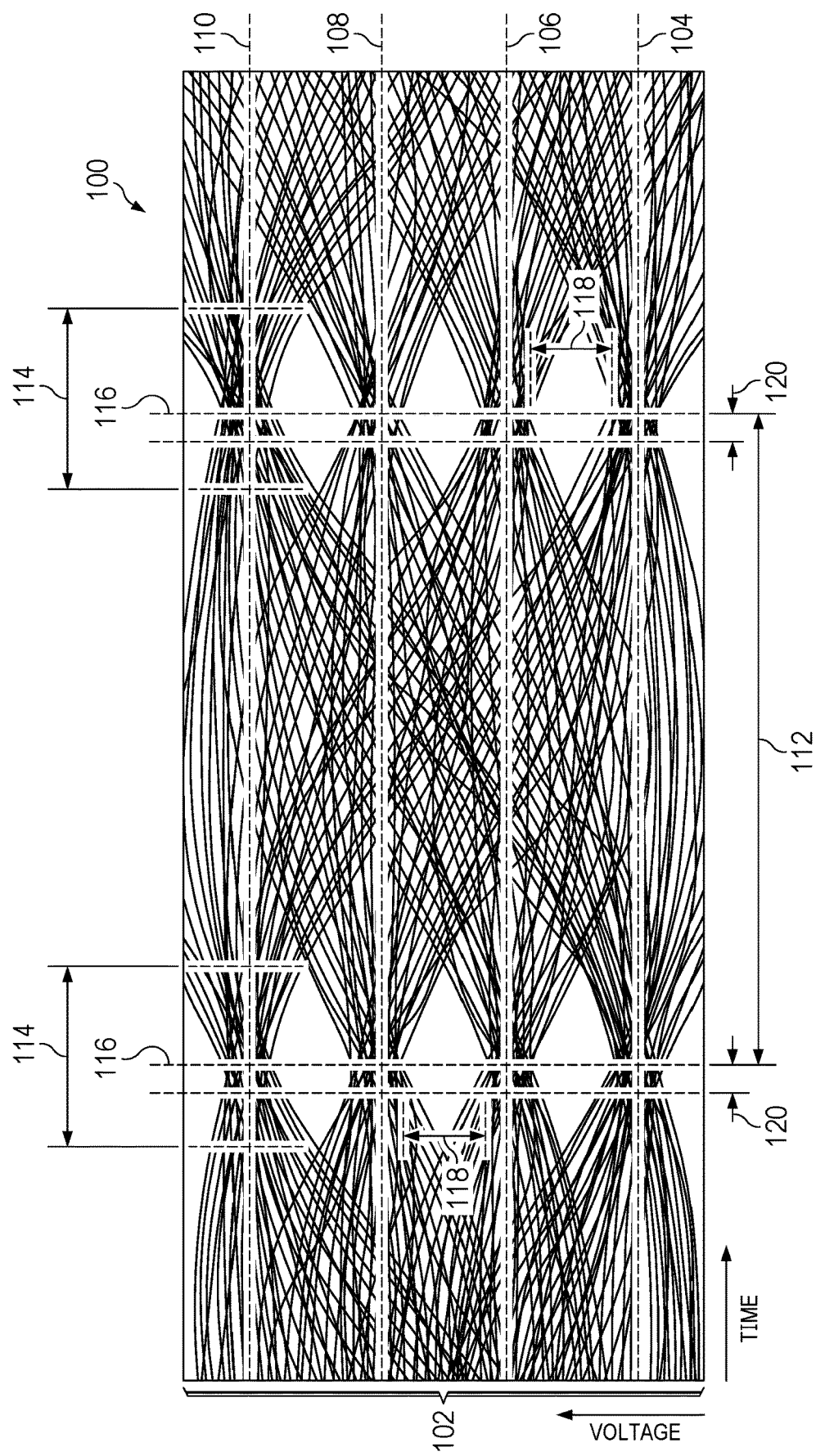
FIG. 1 illustrates an eye pattern for an example pulse amplitude modulation four level (PAM4) signal.

FIG. 1 illustrates an eye pattern 100 for an example pulse amplitude modulation four level (PAM4) signal 102. A horizontal axis represents time, and a vertical axis represents voltage. The PAM4 signal 102 has four voltage levels corresponding to four different possible data values for a symbol in the signal 102. Four possible signal levels permit encoding of two data bits sent per unit interval (UI) 112. The voltage levels are approximated as a first level 104, a second level 106, a third level 108, and a fourth level 110. A signal's UI 112 is the minimum time interval between symbols in the signal 102. In some examples, the UI 112 equals a period of a clock used to generate the signal 102. The eye pattern 100 is a visualization of the probability density function of the signal 102, modulo the UI 112; the cross-hatched region of the signal 102 corresponds to different possible voltage levels of the signal 102 at different times. Accordingly, the eye pattern 100 indicates the probability of the signal 102 being at each possible voltage across the duration of the UI 112. The different voltage levels 104, 106, 108, and 110 surround one or more eyes 114, also referred to as eye openings 114. The probability that the signal 102 will have a voltage within an eye 114 is lowered, because, for example, there is elevated probability that transitions between different voltage levels complete prior to the eye 114, and do not begin until after the eye 114 closes. Accordingly, within periods of time corresponding to eye openings 114, the signal 102 is more likely to have a voltage corresponding to (though not necessarily equaling) one of the distinct voltage levels 104, 106, 108, and 110. This means that during eye openings 114, the signal 102 can be sampled with decreased noise, such as decreased noise attributable to variable timing of transitions between voltage levels 104, 106, 108, and 110.

A center 116 of the eye 114 corresponds to the largest voltage gap 118 between probability bundles of relatively lower voltage levels (such as voltage level 104, 106, or 108) and relatively next-higher voltage levels (such as voltage level 106, 108, or 110, respectively). The signal 102 is intended to be sampled at the eye center 116, which is the sampling timing that produces the highest signal-to-noise ratio (SNR) and achieves the lowest BER. In some examples, a highly accurate clock is used to generate the signal 102, so that the eye center 116 appears at the same phase in each UI 112. A difference between the eye center 116 and an actual sampling time is a phase offset 120 of the sampling time, referred to herein as an offset 120.

For example, a 112 gigabit per second (Gbps) PAM4 signal 102 has a 17 picosecond (ps) UI 112. This means that the symbol is sent during a 17 ps period of a corresponding 66 GHz clock. If the eye 114 is 5 ps wide, giving 2.5 ps between the eye center 116 and the opening or closing edge of the eye 114, then a 0.5 ps offset 120 of the sampling time from the eye center 116 is a 20% deviation. Accordingly, the sampling time is displaced 20% from the eye center 116 towards a timewise boundary of the eye 114, corresponding to a loss in SNR and an increase in BER.

Figure 2:
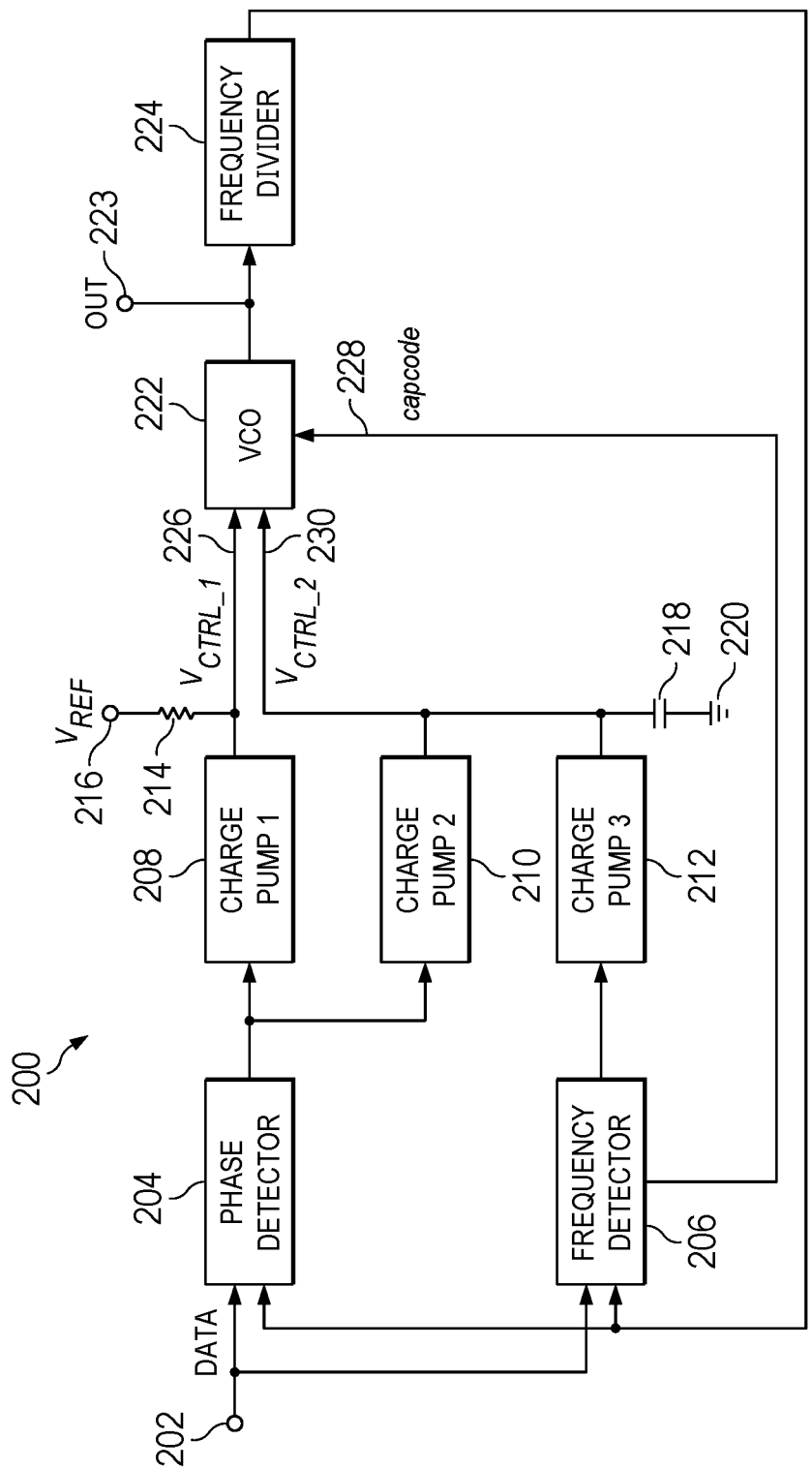
FIG. 2 shows a functional block diagram of an example PLL.

FIG. 2 shows a functional block diagram of an example PLL 200. The PLL 200 includes a data terminal 202, a phase detector 204, a frequency detector 206, first, second, and third charge pumps 208, 210, and 212, a resistor 214, a reference voltage terminal 216, a capacitor 218, a common potential (e.g., ground) 220, a voltage controlled oscillator (VCO) 222, and a frequency divider 224. The data terminal 202 is configured to receive a data stream generated using a clock (not shown) with a frequency $F_{CLK}$. Individual symbols in the data stream can have two or more different voltage levels, and adjacent eyes of the data stream are spaced by the period of the data stream, $1/F_{CLK}$.

The data terminal 202 is connected to a first input of the phase detector 204 and a first input of the frequency detector 206. The frequency detector 206 senses a time between symbols (voltage levels corresponding to data) within the signal 102. The phase detector 204 senses a phase (skew) within a UI 112 to sample the signal 102 to facilitate a maximum SNR. The output of the phase detector 204 is connected to the first charge pump 208 and the second charge pump 210. The output of the first charge pump 208 is connected to a first terminal of the resistor 214 and a first input 226 of the VCO 222. The first input 226 of the VCO 222 has a voltage that is a first control voltage $V_{CTRL\_1}$ of the VCO 222. A second terminal of the resistor 214 is connected to the reference voltage terminal 216, which is configured to receive a reference voltage $V_{REF}$. A first output of the frequency detector 206 is connected to the third charge pump 212, and a second output of the frequency detector 206 is connected to provide a capacitor control code capcode to a second input 228 of the VCO 222.

The outputs of the second and third charge pumps 210 and 212 are connected to a first plate of the capacitor 218 and a third input 230 of the VCO 222. The VCO third input 230 has a voltage that is a second control voltage $V_{CTRL\_2}$ of the VCO 222. A second plate of the capacitor 218 is connected to ground 220. The integral of frequency is phase, and the capacitor 218 acts as an integrator loop filter in a feedback loop of the PLL 200. Accordingly, the VCO 222 uses frequency information received from the frequency detector 206 to determine a frequency of a feedback signal, and uses phase information received from both the phase detector 204 and the frequency detector 206 (via respective charge pumps 208, 210, and 212), to determine a phase of the feedback signal.

The PLL 200 is a second order system, with one pole determined by the second and third charge pumps 210 and 212, and a second pole determined by the VCO 222, which (as described) integrates frequency information to determine the phase of the feedback signal. A first order path, corresponding to the first charge pump 208 and the resistor 214, is used to stabilize this second order system. For example, the VCO 222 includes a capacitor bank controlled using the capcode signal. The capacitor bank of the VCO 222 controls a coarse setting of the frequency of the feedback signal. The VCO 222 uses frequency information received from the frequency detector 206 to control a fine setting of the frequency of the feedback signal. The VCO 222 is connected to output the feedback signal to an output terminal (OUT) 223 of the PLL 200, and to the frequency divider 224. The frequency divider 224 divides the frequency of the feedback signal output by the VCO 222 by a number N, and outputs the resulting modified feedback signal to a second input of the phase detector 204 and a second input of the frequency detector 206.

The PLL 200 determines $F_{CLK}$, as well as a phase of eye centers 116, so that the data stream can be sampled to maximize SNR and, accordingly, minimize BER. However, as described above with respect to FIG. 1, the phase determined by the PLL 200 may include an offset 120 from eye centers 116, thereby reducing SNR and increasing BER. In some examples, this error can arise if a charge pump 208, 210, or 212 receives inputs that should cause the outputs of the respective charge pump 208, 210, or 212 to average to zero, but instead the charge pump 208, 210, or 212 outputs an average to a different, non-zero value. For example, a charge pump 208, 210, or 212 output responsive to a single set of charge pump control inputs can be viewed as a series of packets that ideally have charge values of positive one, negative one, or zero (+1, −1, or 0). Consider a charge pump 208, 210, or 212 that outputs +1.1 instead of +1, and outputs −0.9 instead of −1. If the charge pump 208, 210, or 212 receives ten inputs that ideally result in +1 output, and ten inputs that ideally result in −1 output, the ideal average output is zero, but the actual average output is +0.1 (more specifically, it is given by (10×1.1+10×(−0.9))/20=0.1). This skewed average shifts the sampling time, and corresponds to an offset 120. Accordingly, charge pump-related offsets 120 can be mitigated by calibrating (trimming) the charge pumps 208, 210, and 212, as further described with respect to FIG. 3.

Figure 3:
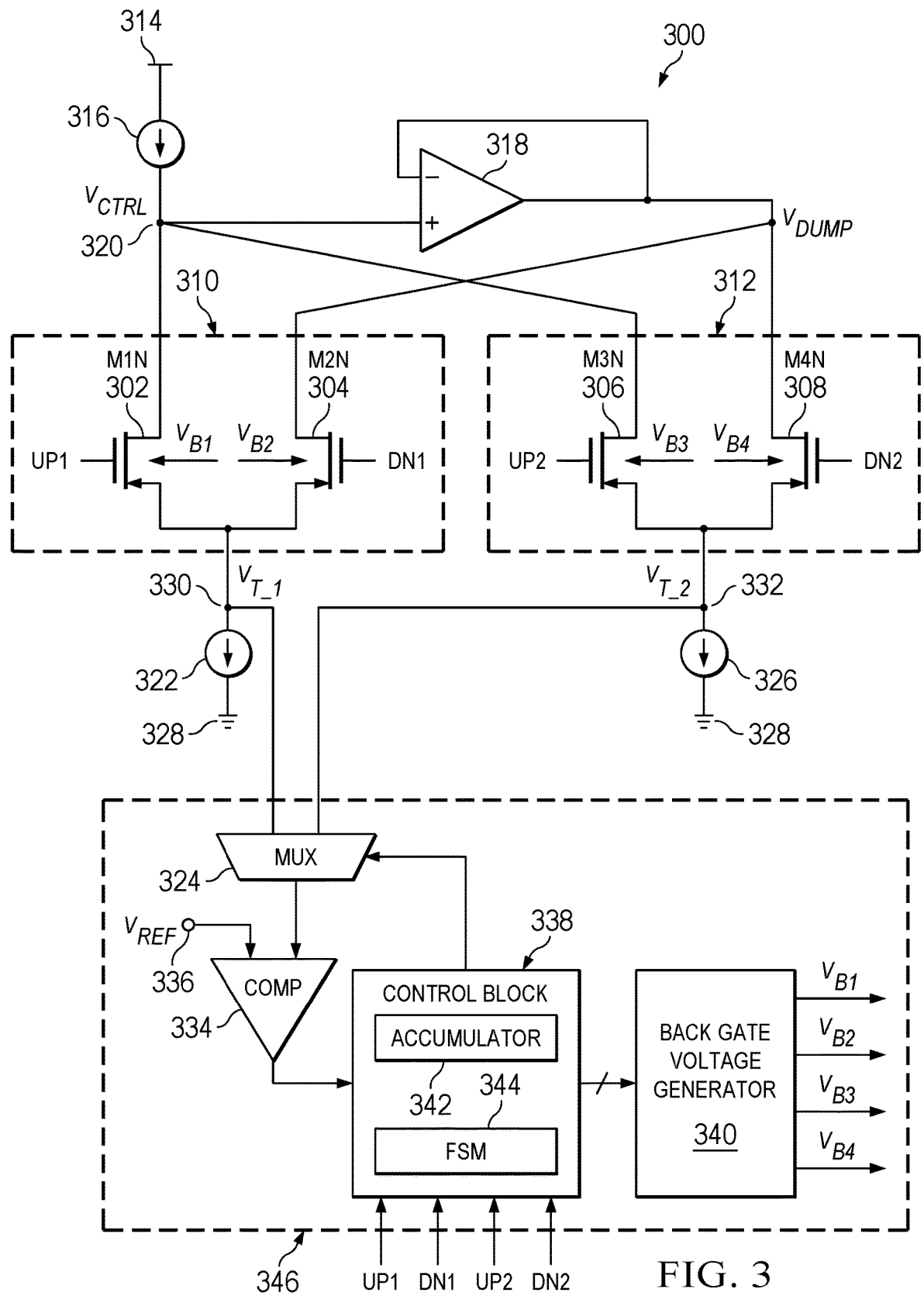
FIG. 3 shows a circuit and functional block diagram of an example charge pump.

FIG. 3 shows a circuit and functional block diagram of an example charge pump system 300. In some examples, some or all of the charge pumps 208, 210, and 212 of FIG. 2 include charge pump system 300. The charge pump system 300 receives an input voltage at an input voltage terminal 314, and outputs to an output voltage terminal 320. The charge pump system 300 includes four n-channel metal oxide semiconductor field effect transistors (MOSFET), M1N 302, M2N 304, M3N 306, and M4N 308. MOSFETs are numbered herein as M[number][channel type]. M1N 302, M2N 304, M3N 306, and M4N 308 are matched devices, meaning they have the same source-drain current in response to receiving the same bias voltages while operating in the same region—for example, while operating in the saturation region. These MOSFETs are organized into two differential pairs, a first differential pair 310 including M1N 302 and M2N 304, and a second differential pair 312 including M3N 306 and M4N 308. The charge pump system 300 also includes a differential amplifier 318, first, second, and third current sources 316, 322, and 326, and a threshold voltage adjustment circuit 346, referred to herein as the calibration circuit 346. The calibration circuit 346 includes a multiplexer (MUX) 324, a comparator (COMP) 334, a control block 338, and a back-gate voltage generator 340. The control block 338 includes an accumulator 342 and a finite state machine (FSM) 344.

A gate of M1N 302 receives, and is biased by, a signal UP1. A gate of M2N 304 receives, and is biased by, a signal DN1. A gate of M3N 306 receives, and is biased by, a signal UP2. A gate of M4N 308 receives, and is biased by, a signal DN2. UP1, DN1, UP2, and DN2 can each have either a relatively high voltage, corresponding to a logical one, or a relatively low voltage, corresponding to a logical zero. Each of M1N 302, M2N 304, M3N 306, and M4N 308 is turned on when its respective gate signal UP1, DN1, UP2, and DN2 has the relatively high voltage, and in complementary fashion each is turned off when the respective gate signal has the relatively low voltage.

The input voltage terminal 314 is connected to a first terminal of a first current source 316. A second terminal of the first current source 316 is connected to a non-inverting input of a differential amplifier 318, a drain of M1N 302, and a drain of M3N 306. An output terminal 320 of the charge pump 300 is located between the second terminal of the first current source 316 and the drains of M1N 302 and M3N 306. The output terminal 320 has a voltage $V_{CTRL}$, corresponding to a control voltage of the VCO 222 (such as $V_{CTRL\_1}$ or $V_{CTRL\_2}$; see FIG. 2).

An inverting input of the differential amplifier 318 is connected to an output of the differential amplifier 318, a drain of M2N 304, and a drain of M4N 308. A voltage at the drains of M2N 304 and M4N 308 is $V_{DUMP}$. A source of M1N 302 is connected to a source of M2N 304, a first terminal of a second current source 322, and a first input of the MUX 324. A source of M3N 306 is connected to a source of M4N 308, a first terminal of a third current source 326, and a second input of the MUX 324. A second terminal of the second current source 322, and a second terminal of the third current source 326, are connected to ground 328. The first, second, and third current sources 316, 322, and 326 each provide a current $I_{SOURCE}$. The output voltage $V_{CTRL}$ depends on which of M1N 302, M2N 304, M3N 306, and M4N 308 are turned on, so that current provided by resulting combinations (or none) of the first, second, and third current sources 316, 322, and 326 flow through the output terminal 320. Current from the first current source 316 flows to the output terminal 320, pulling $V_{CTRL}$ up, and current from the second or third current source 322 or 326 flows away from the output terminal 320, pulling $V_{CTRL}$ down.

A first node 330, located at the sources of M1N 302 and M2N 304 and the first input of the MUX 324, has a voltage $V_{T\_1}$. A second node 332, located at the sources of M3N 306 and M4N 308 and the second input of the MUX 324, has a voltage $V_{T\_2}$. The MUX 324 outputs either $V_{T\_1}$ or $V_{T\_2}$ depending on a MUX control signal. The MUX 324 output is referred to herein as the feedback signal, because the calibration circuit 346 uses the MUX 324 output as input to a feedback loop to calibrate threshold voltages of M1N 302, M2N 304, M3N 306, and M4N 308 via the back-gate voltage generator 340, as described below.

The MUX 324 output is connected to a first input of the comparator 334. A second input of the comparator 334 is connected to a reference voltage terminal 336 that receives a reference voltage $V_{REF}$. $V_{REF}$ is the designed, intended voltage for the transistor source voltages $V_{T\_1}$ and $V_{T\_2}$. The comparator 334 output is connected to a first input of the control block 338. The control block 338 also receives the UP1, DN1, UP2, and DN2 at, respectively, second, third, fourth, and fifth inputs of the control block 338.

The control block 338 is connected to output the MUX control signal, derived from the UP1, DN1, UP2, and DN2 signals, to a control input of the MUX 324. The FSM 344 of the control block 338 acts as a sequencer to determine the MUX control signal in response to the UP1, DN1, UP2, and DN2 signals. Sequencing by the FSM 344 is determined so that the accumulator 342 can accumulate and store error information—the comparator 334 output—corresponding to each of M1N 302, M2N 304, M3N 306, and M4N 308. The FSM 344 uses the accumulated error information stored by the accumulator 342 to determine a back-gate voltage control signal for the control block 338 to send to the back-gate voltage generator 340 corresponding to each of M1N 302, M2N 304, M3N 306, and M4N 308. Accordingly, the control block 338 is connected to output multiple signals to the back-gate voltage generator 340: a signal indicating whether voltage threshold calibration is currently enabled, and four back-gate voltage control signals, one corresponding to each of M1N 302, M2N 304, M3N 306, and M4N 308. These signals are, for example, one bit wide, or multiple bits wide.

A first output of the back-gate voltage generator 340 is connected to provide a voltage $V_{B1}$ to a substrate/buried well of M1N 302, at a body terminal (also referred to as a back-gate) of M1N 302, to provide a body-source bias voltage of M1N 302. A second output of the back-gate voltage generator 340 is connected to provide a voltage $V_{B2}$ to a substrate/buried well of M2N 304, at a body terminal of M2N 304, to provide a body-source bias voltage of M2N 304. A third output of the back-gate voltage generator 340 is connected to provide a voltage $V_{B3}$ to a substrate/buried well of M3N 306, at a body terminal of M3N 306, to provide a body-source bias voltage of M3N 306. A fourth output of the back-gate voltage generator 340 is connected to provide a voltage $V_{B4}$ to a substrate/buried well of M4N 308, at a body terminal of M4N 308, to provide a body-source bias voltage of M4N 308. Applying a body-source bias voltage to a MOSFET can adjust the threshold voltage of the MOSFET. In some examples, a body-source bias voltage of 200 millivolts (mv) reduces a corresponding voltage threshold by 30 mv.

Using signal combinations described below, one of M1N 302 and M2N 304 is turned on at a given time, and one of M3N 306 and M4N 308 is turned on at the given time. Accordingly, one transistor in each differential pair 310 and 312 (two transistors in total) is turned on at the given time. In some typical examples, an "UP" charge pump control signal corresponds to increasing a VCO control voltage and a "DN" charge pump control signal corresponds to decreasing a VCO control voltage. In the example charge pump system 300, as further described below, the combination of UP1 and UP2 set to logical one and DN1 and DN2 set to logical zero corresponds to a DN charge pump control signal; the combination of DN1 and DN2 set to logical one and UP1 and UP2 set to logical zero corresponds to an UP charge pump control signal; and the combination of UP2 and DN1 set to logical one and UP1 and DN2 set to logical zero correspond to a HOLD charge pump control signal, which does not cause a change in the VCO 222.

If UP1 and UP2 are set to logical one and DN1 and DN2 are set to logical zero, then M1N 302 and M3N 306 are turned on and M2N 304 and M4N 308 are turned off. In this example, the output terminal 320 is connected to the first, second, and third current sources 316, 322, and 326. This means that a single instance of $I_{SOURCE}$ flows to the output terminal 320, and two instances of $I_{SOURCE}$ flow away from the output terminal 320, so that a net current equal to $I_{SOURCE}$ flows through the output terminal from outside the charge pump system 300 to balance currents at the output terminal 320. Accordingly, the ideal resulting $V_{CTRL}$ has a voltage responsive to a current output equal to $I_{SOURCE}$, and the ideal current output can be thought of as a negative one (+1−2=−1).

If DN1 and DN2 are set to logical one and UP1 and UP2 are set to logical zero, then M1N 302 and M3N 306 are turned off and M2N 304 and M4N 308 are turned on. In this example, the output terminal 320 is connected to the first current source 316 and disconnected from the second and third current sources 322 and 326. This means that a single instance of $I_{SOURCE}$ flows to, and is output via, the output terminal 320. Accordingly, the ideal resulting $V_{CTRL}$ is responsive to the current output $I_{SOURCE}$, and the ideal current output can be thought of as a positive one (+1).

If UP2 and DN1 are set to logical one and UP1 and DN2 are set to logical zero, then M1N 302 and M4N 308 are turned off and M2N 304 and M3N 306 are turned on. In this example, the output terminal 320 is connected to the first and third current sources 316 and 326 and disconnected from the second current source 322. This means that a single instance of $I_{SOURCE}$ flows to the output terminal 320, and a single instance of $I_{SOURCE}$ flows away from the output terminal 320. No additional currents flow into or out of the output terminal 320 from outside the charge pump system 300 to balance currents at the output terminal 320. Accordingly, the ideal resulting $V_{CTRL}$ for this example is responsive to a zero output current, and the ideal output current can be thought of as zero (+1−1=0).

In some examples, M1N 302, M2N 304, M3N 306, and M4N 308 turn on in the saturation region. For an n-channel type MOSFET operating in the saturation region, drain-source current is related to gate-source voltage and drain-source voltage as shown in Equation 1:

$$I_{DS} = \frac{1}{2}\mu_P C_{OX} \frac{W}{L}(V_{GS} - |V_{TH}|)^2(1 + \lambda V_{DS}) \quad \text{Equation 1}$$

In Equation 1, $I_{DS}$ is drain-source current, $V_{GS}$ is gate-source voltage, $V_{DS}$ is drain-source voltage, $V_{TH}$ is threshold voltage, $\mu_P$ is the charge-carrier effective mobility, Cox is the gate oxide capacitance per unit area, L and W are the length and width of the gate, and $\lambda$ is the channel-length modulation parameter. As represented in Equation 1 by the $1+\lambda V_{Ds}$ term, n-channel type MOSFETs have finite output impedance due to channel length modulation effects. This means that current conducted by the drain-source paths of M1N 302, M2N 304, M3N 306, and M4N 308 while turned on depends not only on their respective gate-source voltages and voltage thresholds, but also on their drain-source voltages. In the example charge pump 200, the drain-source currents of activated transistors (M1N 302, M2N 304, M3N 306, and M4N 308) are held constant according to the first, second, and third current sources 316, 322, and 326. Accordingly, to maintain constant current source currents $I_{SOURCE}$, variation in threshold voltage of M1N 302, M2N 304, M3N 306, and M4N 308 causes variation in one or more of gate-source voltage or drain-source voltage of, respectively, M1N 302, M2N 304, M3N 306, and M4N 308. Gate voltages, corresponding to the UP1, DN1, UP2, and DN2 signals, are assumed herein to be equal for logical zeroes and equal for logical ones. This means that variation in threshold voltage of M1N 302, M2N 304, M3N 306, and M4N 308 corresponds to variation in source voltage or drain voltage of the respective transistor. As described below, variation in drain voltage can be addressed using the error amplifier 318, and variation in source voltage can be addressed using the threshold voltage adjustment circuit 346.

Offsets 120, as described with respect to FIG. 1, can occur due to systematic or random error. Variation in threshold voltage causes offsets 120. In some examples, offsets 120 due to systematic error arise as a result of mismatch between the drain voltages of M1N 302 and M3N 306, which both equal $V_{CTRL}$, and the drain voltages of M2N 304 and M4N 308, which both equal $V_{DUMP}$. This source of systematic error can be mitigated by using the error amplifier 318 to make $V_{CTRL}$ and $V_{DUMP}$ equal. As described above, the output of the error amplifier 318 is fed back to the inverting input of the error amplifier 318. $V_{CTRL}$ is located in a current path that is separate from a current path that includes the $V_{DUMP}$ output of the error amplifier 318. Accordingly, $V_{DUMP}$ changes to equal $V_{CTRL}$.

In some examples, offsets 120 due to random error arise from process variation, specifically, mismatch in the threshold voltages of the transistors comprising the first and second differential pairs 310 and 312. If the threshold voltages of M1N 302, M2N 304, M3N 306, and M4N 308 are different, but the currents conducted by the drain-source paths of M1N 302, M2N 304, M3N 306, and M4N 308 while turned on are held constant by the first, second, and third current sources 208, 210, and 212, and the drain voltages of M1N 302, M2N 304, M3N 306, and M4N 308 are equalized as described above, then the source voltages of M1N 302, M2N 304, M3N 306, and M4N 308 (indicated by $V_{T\_1}$ and $V_{T\_2}$, depending on which of the transistors are activated) are different. For example, the gate-source voltage $V_{GS}$ of M1N 302 while M1N 302 is turned on can be represented as $$V_{GS} = V_{HI} - V_{T\_1}, \quad \text{Equation 2}$$

where $V_{HI}$ is the logical one voltage of UP1, DN1, UP2, and DN2. The $V_{GS}$ of M1N 302 can also be represented as $$V_{GS} = V_{TH\_1} + V_{OVER}, \quad \text{Equation 3}$$

where $V_{TH\_1}$ is the threshold voltage of M1N 302, and $V_{OVER}$ is a constant overdrive voltage required to maintain current through M1N 302 corresponding to the constant current $I_{SOURCE}$. In some examples, overdrive voltage equals 100 mv to 200 mv. Accordingly, $V_{T\_1} = V_{HI} - V_{TH\_1} - V_{OVER}$. Because $V_{HI}$ and $V_{OVER}$ are constant, if $V_{TH\_1}$ changes, then $V_{T\_1}$ changes; and correcting $V_{T\_1}$ also corrects $V_{TH\_1}$. This result also can be seen from Equation 1, as described above.

The source voltage shared by the first differential pair 310 is $V_{T\_1}$, and the source voltage shared by the second differential pair 312 is $V_{T\_2}$. If the drain voltages $V_{CTRL}$ and $V_{DUMP}$ of M1N 302, M2N 304, M3N 306, and M4N 308 (variously) are the same, and the threshold voltages of M1N 302, M2N 304, M3N 306, and M4N 308 are the same, then the source voltages $V_{T\_1}$ and $V_{T\_2}$ of the differential pairs 310 and 312 will be the same. Moreover, if the threshold voltages of M1N 302, M2N 304, M3N 306, and M4N 308 equal designed threshold voltages, then current outputs of respective charge pumps 208, 210, and 210 equal designed current outputs. If $V_{CTRL}$ and $V_{DUMP}$ are the same, but the threshold voltages are different, then $V_{T\_1}$ and $V_{T\_2}$ will be different, and source-drain currents of M1N 302, M2N 304, M3N 306, and M4N 308 responsive to same voltage levels of control signals UP1, DN1, UP2, and DN2 will be different. Accordingly, different threshold voltages give rise to offsets 120 as described with respect to FIG. 1. However, the dependence of $V_{T\_1}$ and $V_{T\_2}$ on the threshold voltages of M1N 302, M2N 304, M3N 306, and M4N 308 means that $V_{T\_1}$ and $V_{T\_2}$ can be used as feedback voltages to adjust the threshold voltages of M1N 302, M2N 304, M3N 306, and M4N 308 to the designed value. This enables the random error arising from different M1N 302, M2N 304, M3N 306, and M4N 308 threshold voltages to be reduced or eliminated.

As described above, the MUX 324 outputs the feedback signal with a voltage of either $V_{T\_1}$ or $V_{T\_2}$, depending on the MUX control signal provided by the control block 338 at the direction of the FSM 344. The MUX control signal provided by the control block 338 depends on the control signals UP1, DN1, UP2, and DN2. The comparator 334 compares the MUX-selected feedback signal to $V_{REF}$, and outputs a voltage corresponding to either a plus or a minus, depending on whether the feedback signal's voltage is greater than or less than $V_{REF}$. If a body-source bias voltage is increased by increasing $V_{B1}$, $V_{B2}$, $V_{B3}$, or $V_{B4}$, then a corresponding threshold voltage of M1N 302, M2N 304, M3N 306, or M4N 308, respectively, is decreased. Similarly, if a body-source bias voltage is decreased by decreasing $V_{B1}$, $V_{B2}$, $V_{B3}$, or $V_{B4}$, then a corresponding threshold voltage of M1N 302, M2N 304, M3N 306, or M4N 308, respectively, is increased. Once the feedback signal equals or approximately equals $V_{REF}$, the comparator 334 will output a signal alternating between plus and minus (or in some examples in which the comparator 334 can output a zero, ceases to modify the digital control signal). Use of a single reference voltage $V_{REF}$ enables $V_{T\_1}$ or $V_{T\_2}$—and accordingly, the threshold voltages of M1N 302, M2N 304, M3N 306, and M4N 308—to be equalized across the combinations of the control signals UP1, DN1, UP2, and DN2.

As described above, the control block 338 continuously outputs four digital back-gate voltage control signals to the back-gate voltage generator 340. Each of these digital back-gate voltage control signals corresponds to one of M1N 302, M2N 304, M3N 306, and M4N 308. The digital back-gate voltage control signals each control the back-gate voltage generator 340 to generate a corresponding one of $V_{B1}$, $V_{B2}$, $V_{B3}$, and $V_{B4}$. $V_{B1}$, $V_{B2}$, $V_{B3}$, and $V_{B4}$ respectively correspond to, and provide a body-source bias voltage for, M1N 302, M2N 304, M3N 306, or M4N 308. The control block 338 continuously outputs the digital back-gate voltage control signals to the back-gate voltage generator 340 to enable the back-gate voltage generator 340 to continuously output corresponding voltages $V_{B1}$, $V_{B2}$, $V_{B3}$, and $V_{B4}$, preventing transient deviation of threshold voltages of M1N 302, M2N 304, M3N 306, and M4N 308, so that the threshold voltages of M1N 302, M2N 304, M3N 306, and M4N 308 remain equal. In some examples, this prevents deviation of the threshold voltages of M1N 302, M2N 304, M3N 306, and M4N 308 from designed values. Accordingly, the feedback loop causes charge pump system 300 behavior to comply with $V_{T\_1} = V_{T\_2} = V_{REF} = V_{HI} - V_{TH} - V_{OVER}$, for the threshold voltages $V_{TH}$ of M1N 302, M2N 304, M3N 306, and M4N 308.

If the control block 338 receives a plus signal from the comparator 334, the accumulator 342 increments a stored value of the digital back-gate voltage control signal corresponding to the transistor M1N 302, M2N 304, M3N 306, or M4N 308 indicated by the MUX control signal determined by the FSM 344. If the control block 338 receives a minus signal from the comparator 334, the accumulator 342 decrements the stored value of the digital back-gate voltage control signal indicated by the MUX control signal determined by the FSM 344. The control block 338 provides the adjusted digital back-gate voltage control signal, and the other digital back-gate voltage control signals, to the back-gate voltage generator 340.

In some examples, the back-gate voltage generator 340 includes a resistor ladder—the back-gate voltage generator 340 can be, for example, a resistor ladder- or R2R-type digital-to analog-converter. The back-gate voltage generator 340 uses the digital control signals received from the control block 338 to generate $V_{B1}$, $V_{B2}$, $V_{B3}$, and $V_{B4}$, which modify the threshold voltages of M1N 302, M2N 304, M3N 306, and M4N 308, respectively.

In some examples, skew of eyes 114, corresponding to offset of eyes 114 within respective UIs 112, can change. A charge pump system 300 can track eye 114 skew to reduce or eliminate offset 120. In some examples, eye 114 skew is tracked continuously. Eye 114 skew can also be triggered based on temperature change, periodically as a background process (such as every 10 ms), or at test time post-fabrication. Frequency of voltage threshold calibration as described with respect to FIG. 2 can depend on, for example, acceptable offset 120 amounts—more frequent charge pump 208, 210, and 212 calibration improves offset tracking and overall SNR. Also, values of $V_{B1}$, $V_{B2}$, $V_{B3}$, and $V_{B4}$ can be loaded into the control block 338, such as from a table, on system start (such as after a power on reset). Accurately calibrated voltage thresholds enable use of fast, small charge pump transistors and wide variations of VCO control voltages in response to varying system temperatures. In some examples, VCO control voltages can range from 0.4 volts to 1.4 volts.

In some examples, some but not all of the charge pumps 208, 210, and 212 are calibrated by the threshold voltage adjustment circuit 346.

In some examples, the comparator 334 can output a zero if the voltage of the feedback signal equals $V_{REF}$. In such examples, this zero output does not cause the accumulator 342 to increment or decrement the back-gate voltage control signal output to the back-gate voltage generator 340.

In some examples, a calibration circuit 346 is used to adjust a threshold voltage of a transistor in a charge pump with a topology other than that shown in FIG. 3. In some examples, a calibration circuit 346 is used to adjust a threshold voltage of a transistor in a circuit other than a charge pump.

In some examples, the accumulator 342 increments or decrements a value of an analog back-gate voltage control signal provided to the back-gate voltage generator 340.

In some examples, the data within the signal 102 is random. In some examples, during some UIs 112, one or more of the charge pumps 208, 210, and 212 receive UP1, DN1, UP2, and DN2 signals that do not include a logical one (none of M1N 302, M2N 304, M3N 306, and M4N 308 are turned on).

In some examples, $V_{T\_1}$ and $V_{T\_2}$ are compared to each other instead of or in addition to a reference voltage $V_{REF}$ as described above, to generate error information to provide to the control block 338 to enable the accumulator 342 to determine corresponding back-gate voltage control signals.

In some examples, the combination of UP1 and DN2 set to logical one and UP2 and DN1 set to logical zero can also be used as a HOLD charge pump control signal.

In some examples, a control circuit other than a finite state machine is used to control the MUX 324, the accumulator 342, and the back-gate voltage generator 340.

In some examples, a memory other than an accumulator is used to accumulate and store error information generated using the comparator 336.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero. Modifications are possible in the described examples, and other examples are possible within the scope of the claims.

What is claimed is:

1. A charge pump, comprising:
an output terminal;
a first transistor including a source, a drain, a gate, and a body terminal, the drain of the first transistor coupled to the output terminal;
a second transistor including a source, a drain, a gate, and a body terminal, the drain part of a current path that is separate from a current path that includes the drain of the first transistor;
a control circuit including an output, the control circuit configured to generate a first control signal in response to a voltage at the gate of the first transistor and a voltage at the gate of the second transistor;
a multiplexer (MUX) including a first input, a second input, a control input, and an output, the first input of the MUX coupled to the source of the first transistor and the second input of the MUX coupled to the source of the second transistor, the control input of the MUX coupled to the output of the control circuit;
a reference voltage terminal adapted to receive a reference voltage; and
a calibration circuit including a first input, a second input, a first output and a second output, the first input of the calibration circuit coupled to the output of the MUX, the second input of the calibration circuit coupled to the reference voltage terminal, the first output of the calibration circuit coupled to the body terminal of the first transistor, and the second output of the calibration circuit coupled to the body terminal of the second transistor.

2. The charge pump of claim 1, wherein the calibration circuit is configured to modify a body-source voltage of a one of the first transistor and the second transistor corresponding to the control input of the MUX in response to a difference between the reference voltage and a voltage at the source of the one of the first transistor and the second transistor corresponding to the control input of the MUX.

3. The charge pump of claim 1, wherein the calibration circuit includes a comparator having a first input, a second input, and an output, the first input of the comparator coupled to the first input of the calibration circuit, the second input of the comparator coupled to the second input of the calibration circuit.

4. The charge pump of claim 3, wherein the calibration circuit includes:

a memory including an input, a first output, and a second output, the input of the memory coupled to the output of the comparator; and a voltage generator including first and second inputs and first and second outputs, the first and second inputs of the generator respectively coupled to the first and second outputs of the memory, the first and second outputs of the generator respectively coupled to the first and second outputs of the calibration circuit.

5. The charge pump of claim 4, wherein the memory is configured to adjust a level of a second control signal in response to the first input of the memory, to adjust a level of a third control signal in response to the second input of the memory, and to continuously provide the second and third control signals respectively to the first and second outputs of the memory; and wherein the voltage generator is configured to generate first and second body signals with voltages respectively responsive to the first and second inputs of the generator.

6. The charge pump of claim 3, wherein the calibration circuit includes:

a memory including first and second inputs and first and second outputs, the first input of the memory coupled to the output of the comparator, the second input of the memory coupled to the output of the control circuit, the memory configured to adjust a level of a second control signal or a third control signal in response to the first and second inputs of the memory, and to continuously output the second and third control signals; and a voltage generator including first and second generator inputs and first and second generator outputs, the first and second generator inputs respectively coupled to the first and second memory outputs, the first and second generator outputs respectively coupled to the first and second calibration outputs, the voltage generator configured to generate first and second body signals with voltages respectively responsive to the first and second inputs of the generator, and to provide the first and second body signals respectively to the first and second outputs of the generator.

7. The charge pump of claim 1, further including:

a third transistor including a source, a drain, a gate, and a body terminal, the source of the third transistor coupled to the source of the first transistor and the first input of the MUX, the drain of the third transistor coupled to the drain of the second transistor;

a fourth transistor including a source, a drain, a gate, and a body terminal, the source of the fourth transistor coupled to the source of the second transistor and the second input of the MUX, the drain of the fourth transistor coupled to the drain of the first transistor and the output terminal;

wherein the control circuit is configured to generate the first control signal in response to a voltage at the gate of the third transistor and a voltage at the gate of the fourth transistor; and wherein the calibration circuit includes third and fourth calibration outputs, the third calibration output coupled to the third body terminal, the fourth calibration output coupled to the fourth body terminal.

8. The charge pump of claim 7, further including first, second, and third current sources, the first current source coupled to the drains of the first and third transistors and the output terminal, the second current source coupled to the sources of the first and fourth transistors, the third current source coupled to the sources of the second and third transistors.

9. The charge pump of claim 7, further including an error amplifier including a non-inverting input, an inverting input, and an output;

wherein the non-inverting input of the error amplifier is coupled to the output terminal and to the drains of the first and third transistors; and wherein the inverting input of the amplifier is coupled to the output of the amplifier and to the drains of the second and fourth transistors.

10. The charge pump of claim 9, wherein the calibration circuit includes a comparator having a first input, a second input, and an output, the first input of the comparator coupled to the first input of the calibration circuit, the second input of the comparator coupled to the second input of the calibration circuit.

11. The charge pump of claim 10, wherein the calibration circuit includes:

a memory including first and second inputs, and first, second, third, and fourth outputs, the first input of the memory coupled to the output of the comparator, the second input of the memory coupled to the output of the control circuit; and a voltage generator including first, second, third, and fourth inputs and first, second, third, and fourth outputs, the first, second, third, and fourth inputs of the voltage generator respectively coupled to the first, second, third, and fourth outputs of the memory, the first, second, third, and fourth outputs of the voltage generator respectively coupled to the first, second, third, and fourth outputs of the calibration circuit.

12. The charge pump of claim 11, wherein the memory is configured to increment or decrement a level of a first, second, third, or fourth generator control signal in response to the memory accumulator input and the memory control input, and to continuously output the first, second, third, and fourth generator control signals; and wherein the generator is configured to generate first, second, third, and fourth signals with voltages respectively responsive to the first, second, third, and fourth generator inputs, and to output the first, second, third, and fourth signals respectively to the first, second, third, and fourth generator outputs.

13. A circuit comprising:

a charge pump including multiple transistors, each of the transistors respectively including a source, a gate, a drain, and a body terminal, the gates of the transistors coupled to be biased by respective UP/DN control signals, a first portion of the multiple transistors coupled to a first source voltage and a second portion of the multiple transistors coupled to a second source voltage that is different than the first source voltage; and a feedback circuit coupled to the charge pump and including:

a multiplexer (MUX) configured to output the first source voltage or the second source voltage in response to the UP/DN control signals;

a comparator configured to compare the MUX output to a reference voltage;

a memory configured to output multiple generator control signals, and to adjust one of the voltage generator control signals in response to the comparator, the one of the voltage generator control signals selected in response to the UP/DN control signals; and a voltage generator configured to generate multiple back-gate voltages in response to respective ones of the generator control signals, and to provide the back-gate voltages to body terminals of respective ones of the transistors.

14. The circuit of claim 13, further including a finite state machine that controls the MUX and the memory in response to the UP/DN control signals.

15. The circuit of claim 13, further including:

an output terminal coupled to less than all of the drains of the transistors; and an error amplifier having a non-inverting input, an inverting input, and an output, the non-inverting input of the error amplifier coupled to the output terminal, the inverting input of the error amplifier coupled to the output of the error amplifier and to the drains of the transistors not coupled to the output terminal.

16. A phase locked loop (PLL), comprising:

a data terminal adapted to receive a data signal;

phase and frequency detection (PFD) circuitry including first and second inputs and first and second outputs, the first input of the PFD circuitry coupled to the data terminal;

a charge pump including:
 an output;
 a first transistor including a source, a drain, a gate, and a body terminal, the drain of the first transistor coupled to the output;
 a second transistor including a source, a drain, a gate, and a body terminal, the drain of the second transistor part of a current path that is separate from a current path that includes the drain of the first transistor;
 a control circuit including an output, the control circuit configured to generate a first control signal in response to a voltage at the gate of the first transistor and a voltage at the gate of the second transistor;
 a multiplexer (MUX) including first and second inputs, a control input, and an output, the first input of the MUX coupled to the source of the first transistor and the second input of the MUX coupled to the source of the second transistor, the control input of the MUX coupled to the output of the control circuit;
 a reference voltage input adapted to receive a reference voltage; and
 a calibration circuit including a first and second inputs and first and second outputs, the first input of the calibration circuit coupled to the output of the MUX, the second input of the calibration circuit coupled to the reference voltage input, the first output of the calibration circuit coupled to the body terminal of the first transistor, and the second output of the calibration circuit coupled to the body terminal of the second transistor;

a voltage controlled oscillator (VCO) including an input and an output, the input of the VCO coupled to the output of the charge pump; and a frequency divider including an input and an output, the input of the frequency divider coupled to the output of the VCO, the output of the frequency divider coupled to the second input of the PFD circuitry.

17. The PLL of claim 16, further including at least one of a resistor or a capacitor coupled to the output of the charge pump and to the input of the VCO.

18. The PLL of claim 16, wherein the calibration circuit is configured to modify a body-source voltage of a one of the first transistor and the second transistor corresponding to the control input of the MUX in response to a difference between the reference voltage and a voltage at the source of the one of the first transistor and the second transistor corresponding to the control input of the MUX.

19. The PLL of claim 16, wherein the calibration circuit includes a comparator having a first input, a second input, and an output, the first input of the comparator coupled to the first input of the calibration circuit, the second input of the comparator coupled to the second input of the calibration circuit.

20. The PLL of claim 19, wherein the calibration circuit includes:

a memory including an input, a first output, and a second output, the input of the memory coupled to the output of the comparator; and a voltage generator including first and second inputs and first and second outputs, the first and second inputs of the generator respectively coupled to the first and second outputs of the memory, the first and second outputs of the generator respectively coupled to the first and second outputs of the calibration circuit.

* * * * *